United States Patent
Liu et al.

(10) Patent No.: US 10,903,070 B2
(45) Date of Patent: Jan. 26, 2021

(54) ASYMMETRIC WAFER BOW COMPENSATION BY CHEMICAL VAPOR DEPOSITION

(71) Applicant: Lam Research Corporation, Fremont, CA (US)

(72) Inventors: Chanyuan Liu, Portland, OR (US); Fayaz A. Shaikh, Lake Oswego, OR (US); Niraj Rana, West Linn, OR (US); Nick Ray Linebarger, Jr., Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/147,061

(22) Filed: Sep. 28, 2018

(65) Prior Publication Data
US 2020/0105523 A1    Apr. 2, 2020

(51) Int. Cl.
*H01L 21/02* (2006.01)
*H01L 23/00* (2006.01)
(Continued)

(52) U.S. Cl.
CPC ...... *H01L 21/02274* (2013.01); *C23C 16/345* (2013.01); *C23C 16/401* (2013.01);
(Continued)

(58) Field of Classification Search
None
See application file for complete search history.

(56) References Cited

U.S. PATENT DOCUMENTS

| 7,070,660 B2 | 7/2006 | Keeton et al. |
| 8,440,259 B2 | 5/2013 | Chiang et al. |

(Continued)

FOREIGN PATENT DOCUMENTS

EP    1050601 A1    11/2000

OTHER PUBLICATIONS

Abdallah et al., "Deposition of AlN films by reactive sputtering: Effective of radio frequency substrate bias" Thin Solid Films, vol. 515, Mar. 12, 2007, pp. 7104-7106.
(Continued)

*Primary Examiner* — Bradley Smith
(74) *Attorney, Agent, or Firm* — Weaver Austin Villeneuve & Sampson LLP

(57) ABSTRACT

Methods for reducing warpage of bowed semiconductor substrates, particularly saddle-shaped bowed semiconductor substrates, are provided herein. Methods involve depositing a bow compensation layer by plasma enhanced chemical vapor deposition on the backside of the bowed semiconductor substrate by region, such as by quadrants, to form a compressive film on a tensile substrate and a tensile film on a compressive substrate. Methods involve flowing different gases from different nozzles on a surface of a showerhead to deliver various gases by region in a one-step operation or flowing gases in a multi-step process by shielding regions of the showerhead during delivery of gases to deliver specific gases from non-shielded regions onto regions of the bowed semiconductor substrate by alternating between rotating the semiconductor substrate and flowing gases to the backside of the bowed semiconductor substrate.

19 Claims, 4 Drawing Sheets

(51) Int. Cl.
*H01L 21/67* (2006.01)
*H01L 21/68* (2006.01)
*H01J 37/32* (2006.01)
*C23C 16/455* (2006.01)
*C23C 16/34* (2006.01)
*C23C 16/40* (2006.01)
*C23C 16/52* (2006.01)

(52) U.S. Cl.
CPC ........ *C23C 16/45565* (2013.01); *C23C 16/52* (2013.01); *H01J 37/32183* (2013.01); *H01J 37/32449* (2013.01); *H01J 37/32458* (2013.01); *H01J 37/32651* (2013.01); *H01L 21/67288* (2013.01); *H01L 21/68* (2013.01); *H01L 23/562* (2013.01); *H01J 2237/3321* (2013.01); *H01J 2237/3341* (2013.01)

(56) References Cited

U.S. PATENT DOCUMENTS

| | | | |
|---|---|---|---|
| 8,728,956 | B2 | 5/2014 | LaVoie et al. |
| 2006/0105106 | A1 | 5/2006 | Balseanu et al. |
| 2006/0220192 | A1 | 10/2006 | Kurachi et al. |
| 2010/0261353 | A1 | 10/2010 | Prins et al. |
| 2011/0256734 | A1 | 10/2011 | Hausmann et al. |
| 2014/0295651 | A1 | 10/2014 | Ramdani |
| 2016/0203971 | A1* | 7/2016 | Tsiang ................ H01L 21/0217 257/640 |
| 2017/0162522 | A1* | 6/2017 | Chang ............... H01L 21/02274 |
| 2017/0243836 | A1 | 8/2017 | Chen et al. |
| 2017/0263466 | A1* | 9/2017 | Ranish ................ H01L 21/2253 |
| 2018/0068860 | A1* | 3/2018 | deVilliers ........... H01L 21/6715 |
| 2018/0127310 | A1 | 5/2018 | Keech et al. |
| 2018/0308670 | A1 | 10/2018 | Wilby et al. |
| 2019/0013250 | A1* | 1/2019 | Miao .................. H01J 37/32165 |
| 2019/0177155 | A1* | 6/2019 | Qian ..................... B81B 3/0072 |
| 2020/0105531 | A1 | 4/2020 | Liu |

OTHER PUBLICATIONS

Sanchez, D., [E-Newsletter] "Coating Materials News" CERAC inc., vol. 20, No. 1, Mar. 2010, pp. 1-4. <URL: http://www.cerac.com>.

Hardy, N., [Webpage] "What are Planar Magnetrons in PVD Coatings?" Semicore Equipment, Inc., Apr. 13, 2013, pp. 3. [Retrieved 2018] <URL:http://www.semicore.com/news/66-planar-magnetron-pvd-coating/>.

U.S. Appl. No. 16/147,090, filed Sep. 28, 2018, Liu et al.

PCT International Search Report and Written Opinion, dated Jun. 18, 2019, issued in PCT/US2018/061684.

Office Action dated Jun. 26, 2020 issued in U.S. Appl. No. 16/147,090.

* cited by examiner

ASYMMETRIC WAFER BOW COMPENSATION BY CHEMICAL VAPOR DEPOSITION

BACKGROUND

Semiconductor manufacturing processes involve many deposition and etching operations, which can change wafer bow drastically. For example, in 3D-NAND fabrication, which is gradually replacing 2D-NAND chips due to lower cost and higher reliability in various applications, multi-stacked films with thick, high stress carbon-based hard masks can cause significant wafer warpage, leading to front side lithographic overlay mismatch, or even wafer bow beyond chucking limit of an electrostatic chuck.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods of processing semiconductor substrates are provided. One aspect involves a method including: providing a bowed semiconductor substrate having a first tensile region and a first compressive region; and mitigating bowing of the bowed semiconductor substrate by depositing a bow compensation layer on the backside of the bowed semiconductor substrate, the bow compensation layer including a second tensile region and a second compressive region.

In various embodiments, the method also includes, prior to mitigating the bowing, aligning the bowed semiconductor substrate to a backside showerhead such that the first tensile region and first compressive region are aligned to nozzles of the backside showerhead for delivering gases for forming the second tensile region and the second compressive region on the backside of the bowed semiconductor substrate.

In various embodiments, the bowed semiconductor substrate is asymmetrically bowed. In various embodiments, the bow compensation layer is deposited by plasma enhanced chemical vapor deposition.

In some embodiments, the bowed semiconductor substrate after mitigating bowing has a warpage between −500 µm and +500 µm.

In some embodiments, the bowed semiconductor substrate is bowed up to about 100 µm as measured from the lowest point of the bowed semiconductor substrate to the highest point of the bowed semiconductor substrate prior to depositing the bow compensation layer.

In some embodiments, the bowed semiconductor substrate is saddle-shaped prior to depositing the bow compensation layer.

The bowed semiconductor substrate may have an x-axis bowing of greater than 200 µm and y-axis bowing greater than 200 µm prior to depositing the bow compensation layer, and whereby either x-axis bowing or y-axis bowing is negative and the other is positive.

In some embodiments, the second tensile region includes silicon nitride deposited by exposing the first tensile region to a silicon-containing precursor and ammonia and igniting a single frequency radio frequency plasma.

In various embodiments, second tensile region and second compressive region of the bow compensation layer are on alternating quadrants of the bow compensation layer.

In some embodiments, the bow compensation layer is deposited in two or more separate operations. For example, the two or more separate operations may include an operation for deposition of the second tensile region of the bow compensation layer and an operation for deposition of the second compressive region of the bow compensation layer.

In some embodiments, the second compressive region includes silicon oxide deposited by exposing the first compressive region to a silicon-containing precursor and nitrous oxide and igniting a single frequency radio frequency plasma.

In various embodiments, the second compressive region includes carbon.

In various embodiments, the second compressive region includes silicon.

In some embodiments, the second compressive region is deposited on the first compressive region of the bowed semiconductor substrate by igniting a dual frequency radio frequency plasma or a low frequency radio frequency plasma.

In some embodiments, deposition of the bow compensation layer includes flowing nitrogen to a first set of two opposite quadrants while flowing a silicon-containing precursor and ammonia to the backside of the bowed semiconductor wafer to a second set of two opposite quadrants and igniting a radio frequency plasma, rotating the bowed semiconductor wafer by 90 degrees, and flowing a silicon-containing precursor and nitrous oxide to the first set of opposite quadrants and igniting a dual frequency radio frequency plasma.

In various embodiments, the bow compensation layer includes material from the group consisting of silicon oxide, silicon nitride, carbon, silicon, and combinations thereof.

In some embodiments, the bow compensation layer includes two or more compositions.

In some embodiments, depositing the bow compensation layer further includes flowing a mixture of gases to intermediate regions between two or more adjacent quadrants.

In various embodiments, the flow of a silicon-containing gas to the backside of the bowed semiconductor substrate modulates stress of the bow compensation layer.

These and other aspects are described further below with reference to the drawings.

DETAILED DESCRIPTION

Figure 1:
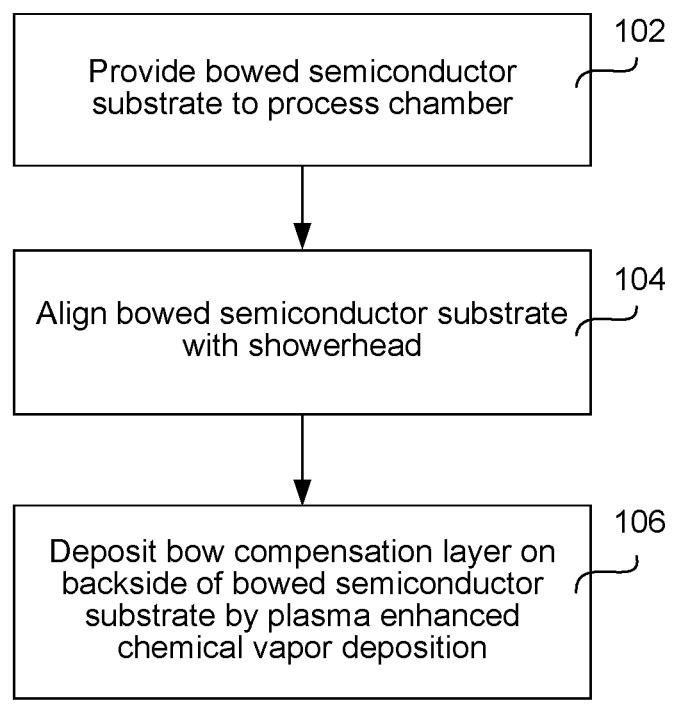
FIG. 1 is a process flow diagram showing operations of a method performed in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "wafer" and "substrate" are used interchangeably. One of ordinary skill in the art would understand in many embodiments the methods and apparatus described herein can be used prior to or during processing of a silicon wafer during any of many stages of integrated circuit fabrication thereon. A wafer or substrate used in the semiconductor device industry typically has a diameter of 200 mm, 300 mm, or 450 mm. Other types of reactors that may benefit from the disclosed embodiments include those used to fabricate various articles such as printed circuit boards, displays, and the like. In addition to semiconductor wafers, the methods and apparatus described herein may be used with deposition chambers configured for other types of substrates including glass and plastic panels. Accordingly, where the term "wafer" is used in the description below, it will be understood that the description also applies to a panel or other substrate.

Semiconductor fabrication processes involve formation of various structures, many of which may be two-dimensional. As semiconductor device dimensions shrink and devices are scaled to be smaller, the density of features across a semiconductor substrate increases, resulting in a layers of material etched and deposited in various ways, including in three dimensions. For example, 3D-NAND is one technology that is becoming increasingly popular due to lower cost and increased memory density compared to other techniques, such as 2D-NAND, and higher reliability in various applications. During the fabrication of a 3D-NAND structure, wafer bow can change drastically. For example, deposition of thick hard mask materials and etching of trenches along a wafer surface in fabricating a 3D-NAND structure can cause wafer bowing. As layers of films are stacked on top of each other during fabrication, more stress is introduced to the semiconductor wafer which can cause bowing. Bowing can be measured using an optical technique. Wafer bowing can be measured or evaluated by obtaining a wafer map. Bowing can be quantified using a bow value or warpage value as described herein, which is measured as the vertical distance between the lowest point of the semiconductor wafer to the highest point on the wafer. The warpage value can be along an axes—for example, an asymmetrically warped wafer may have an x-axis warpage and a y-axis warpage.

In a bow-shaped wafer, the lowest point is the center of the wafer and the highest point is the edge of the wafer. In a dome-shaped wafer, the lowest point is the edge of the wafer and the highest point is the center of the wafer. Bow-shaped and dome-shaped wafers have symmetrical bowing. Wafers can also have asymmetric bowing. In asymmetric bowing, warpage is measured along an x-axis and a y-axis. An asymmetrically bowed wafer has different values for the x-axis warpage and y-axis warpage. In some cases, an asymmetrically bowed wafer has a negative x-axis warpage and a positive y-axis warpage. In some cases, an asymmetrically bowed wafer has a positive x-axis warpage and a negative y-axis warpage. In some cases, an asymmetrically bowed wafer has both a positive x-axis warpage and a positive y-axis warpage, but the warpage values are different. In some cases, an asymmetrically bowed wafer has both a negative x-axis warpage and a negative y-axis warpage, but the warpage values are different. One example of an asymmetrically bowed wafer is a saddle-shaped wafer. For a saddle-shaped wafer, in one example, the warpage on the x-axis may be 200 μm and the warpage on the y-axis may be −200 μm. Saddle-shaped wafers have two opposing edges of the wafer that are curved upward while another two opposing edges of the wafer are curved downward.

Bowing can cause problems with subsequent processing, such as during lithography, as etching can be uneven if the semiconductor substrate is warped. High bowing can be caused by deposition of thick, high stress carbon hard mask layer. Additionally, due to multi-stacked films and the presence of thick, high stress carbon-based hard masks used in such fabrication processes, etching can cause some asymmetric warpage and deposition processes can introduce significant wafer warpage of up to a variation of between ±500 μm to −1300 μm bow. For example, an ashable hard mask may have a stress of up to −1000 MPa and have introduce a bow value of up to −1000 μm. Addressing such wafer warpage can be a challenge as subsequent processing may be affected by a wafer warpage exceeding +500 μm, and can be a particular challenge, especially when wafers are used in subsequent processing involve chucking of the wafer to an electrostatic chuck, as many electrostatic chucks have a "chucking limit," which is defined as the maximum warpage tolerated before the wafer cannot be effectively chucked. Many electrostatic chucks have a chucking limit of about +300 μm. As a result, highly warped semiconductor substrates may not be processed in some tools. Additionally, processing of highly warped semiconductor substrates may cause further warping. For example, etching of a trench in one direction can cause warping in asymmetric bowing due to asymmetric stress on the semiconductor substrate.

Some techniques exist for addressing symmetric bowing of semiconductor wafers, and in some cases, techniques can be used to reduce warpage by changing the process for fabricating the desired layers in the substrate. However, few techniques exist for compensating for asymmetric wafer warpage such as saddle-shaped bowing.

Provided herein are methods of processing bowed semiconductor substrates to mitigate bowing by depositing a bow compensation layer on the backside of the bowed semiconductor substrate by plasma enhanced chemical vapor deposition (PECVD) to compensate for the bowing on the front side of the semiconductor substrate. For example, a compressive bow compensation layer is deposited on the backside of a bowed semiconductor substrate on regions having a compressive film on the front side of the semiconductor substrate and a tensile bow compensation layer is deposited on the backside of a bowed semiconductor substrate on regions having a tensile film on the front side of the semiconductor substrate.

Backside deposition may be performed by inserting the semiconductor wafer into a process chamber having both a top showerhead and a bottom showerhead (the bottom showerhead of which may be referred to as a showerhead to the pedestal, or a "shaped"), with wafer holders to hold the wafer between the two showerheads. Processing may be performed by positioning the wafer close to the top showerhead and delivering process gases to the backside of the wafer via the bottom showerhead. In some embodiments, the wafer may be placed upside down to use the top showerhead to deliver gases to the backside of the wafer, but in many embodiments, the wafer is placed upright with the patterned regions facing up and process gases are delivered to the backside of the wafer from a bottom showerhead. In various embodiments, the backside of the wafer is flat and is not patterned. Showerheads subsequently described herein refer to bottom showerheads used for delivering gases to a backside of a semiconductor wafer.

In various embodiments, a showerhead includes multiple holes or nozzles for flowing process gases to the backside of the semiconductor wafer. In some embodiments, a showerhead includes thousands of small holes for flowing process gases. Holes may have a diameter between about 0.5 mm and about 1 mm. Holes on the surface of a showerhead can be divided into regions. In some embodiments, each region of holes can be programmed to deliver a specific process gas. Each region can deliver a different gas. In some embodiments, several holes can be programmed to deliver a specific process gas. Holes in the showerhead can be programmed to deliver different gases. In some embodiments, each hole can be programmed to either flow a specific process gas or not flow any gas.

In some embodiments, process gases are flowed to all of the holes evenly. In some embodiments, all gases flowed to the showerhead to be delivered to the gases are delivered via every hole in the showerhead. In some embodiments, holes in the showerhead all deliver the same gas at the same time. In various embodiments described herein, showerheads where process gases are flowed to all of the holes evenly may be used in conjunction with a shield to block holes in certain regions on the surface of the showerhead.

Regions of holes of the showerhead as well as exposed regions that are not shielded may be of any shape. In some embodiments, regions are radially divided shapes, such as a quadrant. In some embodiments, the shield includes two opposite quadrants to prevent gases from being delivered to two quadrants of the semiconductor wafer surface. While a quadrant may refer to one of four equally sized regions divided radially on the surface of a showerhead, quadrants described herein may also refer to regions smaller than four equally sized radially divided regions on a surface of the showerhead.

In various embodiments, the process chamber includes wafer aligning technology to align regions of the wafer with corresponding regions of the showerhead. For example, a detector and motor can be used to align the wafer such that regions having tensile films on the front side are aligned with regions of the showerhead having nozzles programmed to deliver gases for forming a tensile film on the backside, and regions having compressive films on the front side are aligned with regions of the showerhead having nozzles programmed to deliver gases for forming a compressive film on the backside. In some embodiments, the wafer is aligned to the shield such that wafer regions having tensile films on the front side are aligned with exposed, non-shielded nozzles programmed to deliver gases for forming a tensile film on the backside, and regions having compressive films on the front side are aligned with exposed, non-shielded nozzles programmed to deliver gases for forming a compressive film on the backside. It is understood that using a showerhead in conjunction with a shield may involve flowing gases and rotating the wafer (and/or rotating the shield) for a multi-step deposition process for forming a wafer bow compensation layer in accordance with certain disclosed embodiments. The shield may have a thickness of about 1 mm. In some embodiments, the shield is made of a metal material, such as aluminum, or ceramic material, such as aluminum oxide ($Al_2O_3$).

FIG. 1 is a process flow diagram showing operations performed in a method in accordance with certain disclosed embodiments. In operation 102, a bowed semiconductor substrate is provided to a process chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Some of the one or more layers may be patterned. Non-limiting examples of layers include dielectric layers and conducting layers, e.g., silicon oxides, silicon nitrides, silicon carbides, metal oxides, metal nitrides, metal carbides, and metal layers. In various embodiments, the substrate is patterned.

In some embodiments, the semiconductor substrate includes a patterned 3D-NAND structure and one or more etched trenches in the substrate.

The bowed semiconductor substrate may have a warpage of about +1000 μm. In some embodiments, the bowed semiconductor substrate has a warpage greater than +300 μm and less than about +1000 μm. In some embodiments, the bowed semiconductor substrate has symmetric bowing. In some embodiments, the bowed semiconductor substrate has asymmetrical bowing. In some embodiments, the bowed semiconductor substrate is saddle-shaped.

The substrate is provided to a process chamber having a wafer holder and a bottom showerhead for delivering gases to the backside of the semiconductor substrate. In some embodiments, the process chamber includes a shield between the bottom showerhead and the backside of the wafer. The shield may be set at any suitable distance from the backside of the semiconductor wafer, such as between about 1 mm and about 1 cm in some embodiments. As the shield is placed closer to the backside of the wafer, the film edge between the compressive and tensile regions will be sharper. A larger gap between the shield and the wafer will lead to a sloped film edge. The distance of the gap between wafer and shield can be changed to allow a smooth transition from the compressive regions to the tensile regions. The position of the shield may depend on the hardware used. In some embodiments, the shield may be set at a distance between about 1 mm and about 1 cm from a surface of a semiconductor wafer as measured from the surface of the shield to the closest point of the bowed semiconductor wafer. The shield may have two quadrants for blocking opposite quadrants of the showerhead from delivering gases. In some embodiments, a shield is not used and gas delivery is controlled by designating different gases to be delivered out of different regions of the showerhead.

In operation 104, the bowed semiconductor substrate is aligned with the showerhead. In various embodiments, for an asymmetrically bowed semiconductor substrate, aligning is performed by determining which regions of the bowed semiconductor substrate have pivot points between curving up and curving down on the substrate such that the pivot points align with the divisions of regions of the showerhead for delivering gases. Alignment can be performed by using a wafer aligned based on laser scan of a notch position and can be aligned to +1 degree accuracy. Divisions of the regions of the showerhead for delivering gases may be made from radial regions of the showerhead surface, such as splitting a showerhead's nozzles into quadrants, with the convergence point between the four regions being in the center of the showerhead surface. Other divisions may be used instead of quadrants; additionally, uneven warpage of the wafer can be addressed by using intermediate regions that overlap in quadrants as further described below, or may be addressed by flowing certain gases via a first set of holes in a showerhead while flowing another set of gases via a second set of holes in the same showerhead simultaneously. In some embodiments, rather than quadrants, gases may be delivered from other radial regions, each region being any of 1% to 100% of the entirety of the showerhead. Regions in some embodiments may not be radial; any shape of a region of holes on a showerhead may be selected to flow certain gases.

In operation 106, a bow compensation layer is deposited on the backside of the bowed semiconductor substrate to mitigate bowing and flatten the semiconductor substrate. In one embodiment, the bow compensation layer is deposited in a one-step process of flowing various gases, which may be the same or different, across different regions of holes of a showerhead surface to deposit the desired material having the desired stress on the backside of the bowed semiconductor substrate.

In some embodiments, operation 106 may involve more than one operation of deposition and may include, in some embodiments, rotating the semiconductor substrate between depositions in a multi-step process. An example is provided further below with respect to FIG. 2.

The composition of the bow compensation layer depends on the wafer it is being deposited on. For example, the bow compensation layer may include a compressive film when deposited on a compressive region of a wafer, or include a tensile film when deposited on a tensile region of a wafer, or both. Example materials for a compressive film to be deposited on the backside of the wafer include silicon oxide, silicon nitride, silicon, and carbon. Silanes may be used to deposit amorphous silicon as a compressive or tensile film. Acetylene, methane, ethylene, and other carbon-containing deposition precursors such as hydrocarbons may be used to deposit compressive carbon materials, or in some embodiments, neutral stress materials. The selection of deposition precursors and process conditions can be used to tune the stress of the bow compensation layer.

In various embodiments, a compressive film may be a compressive silicon oxide film or a compressive silicon nitride film. In various embodiments, a tensile film may be a tensile silicon nitride film or a tensile silicon oxide film.

"Silicon oxide" is referred to herein as including chemical compounds including silicon and oxygen atoms, including any and all stoichiometric possibilities for $Si_xO_y$, including integer values of x and y and non-integer values of x and y. For example, "silicon oxide" includes compounds having the formula $SiO_n$, where $1 \leq n \leq 2$, where n can be an integer or non-integer values. "Silicon oxide" can include sub-stoichiometric compounds such as $SiO_{1.8}$. "Silicon oxide" also includes silicon dioxide ($SiO_2$) and silicon monoxide (SiO). "Silicon oxide" also includes both natural and synthetic variations and also includes any and all crystalline and molecular structures, including tetrahedral coordination of oxygen atoms surrounding a central silicon atom. "Silicon oxide" also includes amorphous silicon oxide and silicates. Silicon oxide may also include trace amounts or interstitial amounts of hydrogen (SiOH). Silicon oxide may also include trace amounts of nitrogen, particularly if nitrogen gas is used as a carrier gas (SiON).

"Silicon nitride" is referred to herein as including any and all stoichiometric possibilities for $Si_xN_y$, including integer values of x and y and non-integer values of x and y; for example, a ratio X:Y may be 3:4. For example, "silicon nitride" includes compounds having the formula $SiN_n$, where $1 \leq n \leq 2$, where n can be an integer or non-integer values. "Silicon nitride" can include sub-stoichiometric compounds such as $SiN_{1.8}$. "Silicon nitride" also includes $Si_3N_4$ and silicon nitride with trace and/or interstitial hydrogen (SiNH) and silicon nitride with trace amounts of or interstitial oxygen (SiON) or both (SiONH). "Silicon nitride" also includes both natural and synthetic variations and also includes any and all lattice, crystalline, and molecular structures, including trigonal alpha-silicon nitride, hexagonal beta-silicon nitride, and cubic gamma-silicon nitride. "Silicon nitride" also includes amorphous silicon nitride and can include silicon nitride having trace amounts of impurities.

Figure 2:
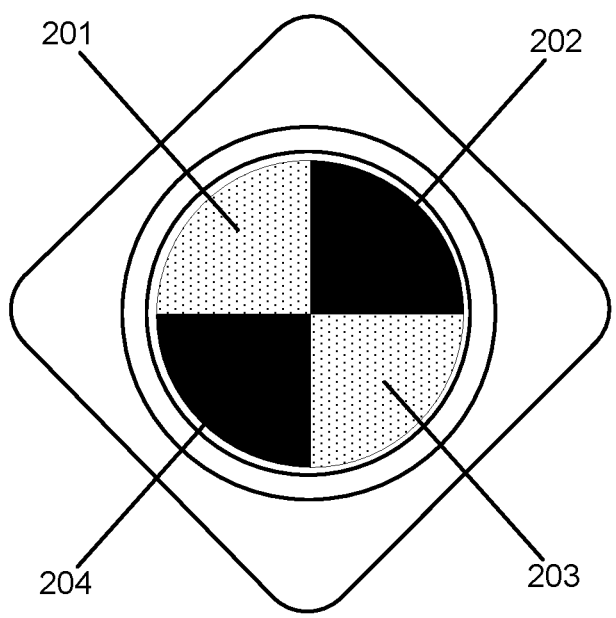
FIGS. 2 and 3 are views of schematic drawings of showerhead delivery by regions to deposit different stress materials onto different regions of a semiconductor wafer in accordance with certain disclosed embodiments.

FIG. 2 provides an example of a divided showerhead surface having quadrants, each quadrant capable of delivering different or same gases for forming different or same materials. In this example, region 201 and 203 are "opposite regions" and regions 202 and 204 and "opposite regions." Regions 201 and 202 are "adjacent regions." Other adjacent regions include 202 and 203; 203 and 204; and 204 and 201.

For deposition of a bow compensation layer on an asymmetrically bowed semiconductor substrate, gases delivered to one set of opposite regions may be the same to both of those regions (such as gases delivered to 201 and 203), while gases delivered to a second set of opposite regions may be the same for both of those regions (such as gases delivered to 202 and 204), but gases delivered between sets may be different (gases delivered to 201 and 203 are different from gases delivered to 202 and 204). In some embodiments, gases delivered to each set may involve flowing two or more gases, some of which may be the same across all regions, and some which may be different.

In one example, silane is flowed to all four regions 201, 202, 203, and 204 with simultaneous flow of nitrous oxide to regions 201 and 203 and nitrogen to 202 and 204. Thus, silane and nitrous oxide is flowed to 201, silane and nitrogen is flowed to 202, silane and oxygen is flowed to 203, and silane and nitrogen is flowed to 204. Alternatively, silicon oxide may be deposited by introducing tetraethyl orthosilicate (TEOS) and oxygen gas. This can be used to deposit a silicon oxide film on semiconductor substrate regions that are aligned with regions 201 and 203, and a silicon nitride film on semiconductor substrate regions that are aligned with regions 202 and 204.

Example process conditions for depositing compressive nitride and tensile nitride are provided in Table 1. These process conditions are suitable for a four-station tool.

TABLE 1

Process Conditions for Compressive Nitride and Tensile Nitride.

| Process Conditions | Compressive Nitride | | Tensile Nitride | |
| --- | --- | --- | --- | --- |
| | Suitable Range | Example | Suitable Range | Example |
| Flow Rate of $NH_3$ (sccm) | 8400-15600 | 12000 | 5040-9360 | 7200 |
| Flow Rate of $SiH_4$ (sccm) | 1400-2600 | 2000 | 140-260 | 200 |
| Flow rate of $N_2$ to bottom of substrate (sccm) | 8400-15600 | 12000 | 4480-8320 | 6400 |

TABLE 1-continued

Process Conditions for Compressive Nitride and Tensile Nitride.

| Process Conditions | Compressive Nitride | | Tensile Nitride | |
| --- | --- | --- | --- | --- |
| | Suitable Range | Example | Suitable Range | Example |
| Flow rate of $N_2$ to top of substrate (sccm) | 2800-5200 | 4000 | 2800-5200 | 4000 |
| High Frequency Plasma Power (W) | 330-960 | 480 W | 840-2400 | 1200 W |
| Low Frequency Plasma Power (W) | 700-2000 | 1000 W | 0 W | 0 W |
| Pressure (Torr) | 1-3 | 1.8 | 1-3 | 2 |

Example process conditions for depositing compressive oxide are provided in Table 2. These process conditions are suitable for a four-station tool.

TABLE 2

Process Conditions for Compressive Oxide

| Process Conditions | Compressive Oxide | |
| --- | --- | --- |
| | Suitable Range | Example |
| Flow rate of $N_2O$ (sccm) | 16800-31200 | 24000 |
| Flow Rate of $SiH_4$ (sccm) | 84-156 | 120 |
| Flow rate of $N_2$ to bottom of substrate (sccm) | 2240-4160 | 3200 |
| Flow rate of $N_2$ to top of substrate (sccm) | 2800-5200 | 4000 |
| High Frequency Plasma Power (W) | 1680-4800 | 2400 |
| Low Frequency Plasma Power (W) | 420-1200 | 600 |
| Pressure (Torr) | 0.5-2 | 1.2 |

In certain disclosed embodiments, deposition of the backside compensation layer is performed at a substrate temperature greater than 300° C., or between about 300° C. and about 550° C., or about 300° C. Higher temperatures may be used in some embodiments to achieve higher stress, or may be used to increase stability of the film deposited. In some embodiments, the showerhead temperature is set to a temperature greater than 300° C., or between about 300° C. and about 550° C., or about 330° C.

In one example, ammonia and silane may be introduced to two opposite quadrants while igniting a single frequency plasma to achieve a tensile silicon nitride film while silane and nitrous oxide may be introduced to the other two opposite quadrants to achieve a compressive silicon oxide film. For a showerhead capable of delivering different gases simultaneously out of different holes on the showerhead, operation 106 of FIG. 1 may be performed by delivering silane out of all holes of the showerhead while delivering ammonia via holes of the showerhead nozzles in regions 201 and 203 in FIG. 2 and delivering nitrous oxide via holes of the showerhead in regions 202 and 204 to deposit a bow compensation layer having two opposite quadrants of tensile silicon nitride material and two opposite quadrants of compressive silicon oxide material. For a showerhead capable of delivering all the same gas simultaneously out of all holes for use in conjunction with a shield, a multi-step process may be performed such that in a first operation, the shield shields regions 202 and 204 while silane and nitrous oxide are delivered via exposed holes in regions 201 and 203 to deposit compressive oxide; in a second operation, the wafer is rotated 90 degrees; and in a third operation, the shield shields regions 201 and 203 while silane and ammonia are delivered to exposed holes in regions 202 and 204 to yield a bow compensation layer having tensile silicon nitride on surfaces exposed to regions 202 and 204 and compressive silicon oxide on surfaces exposed to regions 201 and 203. This can be used to compensate an asymmetrically shaped wafer. In some embodiments, before rotating the shield, a purge gas, such as an inert gas, may be delivered to the showerhead to flush the environment. Example purge gases include nitrogen, argon, and helium.

Note that while silane is described herein as an example process gas, other silicon-containing gases may be used for depositing silicon-containing films, such as tetraethyl orthosilicate (TEOS). The selection of a silicon-containing precursor and reactants used as well as the plasma type (dual or single frequency) and process conditions may affect the stress of the film being deposited. For example, a mixture of silane and ammonia ignited using a single frequency radio frequency plasma such as a high frequency plasma may form a tensile silicon nitride film, while a mixture of silane and ammonia ignited using a dual frequency radio frequency plasma source may result in a compressive silicon nitride film. Additionally, a mixture of silane and nitrous oxide ignited using a single frequency plasma may result in a compressive silicon oxide film. Tensile silicon oxides may also be formed, such as by using TEOS and oxygen in some embodiments.

Silicon-containing precursors suitable for use in accordance with certain disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bi(tertiarybutylamino)silane ($SiH_2(NHC(CH_3)_3)_2$ (BTBAS), tert-butyl silylcarbamate, $SiH(CH_3)$—

(N(CH$_3$)$_2$)$_2$, SiHCl—(N(CH$_3$)$_2$)$_2$, (Si(CH$_3$)$_2$NH)$_3$ and the like. A further example of an aminosilane is trisilylamine (N(SiH$_3$)).

The bow compensation layer may be deposited for a duration of up to 1000 seconds. In some embodiments, the flow rate of the silicon-containing precursor relative to other gases flowed during deposition of the bow compensation layer may modulate the stress. For example, in deposition of compressive silicon nitride, increase in silane flow may decrease stress, making what would be a compressive silicon nitride film less compressive. That is, in some embodiments, increase in silane flow causes the deposited film to be less compressive.

In some embodiments, for deposition of a tensile silicon nitride film, a ratio of flow rate of silicon-containing gas to nitrogen-containing gas may be between about 1:30 and about 1:40, or about 1:36. An example range of high frequency plasma power may be between about 840 W and 2400 W, or about 1200 W for a four-station tool. The low frequency plasma power may not be used in various embodiments, such as if depositing a tensile nitride film.

In some embodiments, for deposition of a compressive silicon nitride film, a ratio of flow rate of silicon-containing gas to flow rate of gas mixture containing nitrogen-containing gas may be between about 1:4 and about 1:8, or about 1:6. An example range of high frequency plasma power may be between about 330 W and 960 W, or about 480 W for a four-station tool. An example range of low frequency plasma power may be between about 700 W and about 2000 W, or about 1000 W for a four-station tool.

In some embodiments, for deposition of a compressive silicon oxide film, a ratio of flow rate of silicon-containing gas to flow rate of a gas mixture containing oxygen-containing gas may be between about 1:4 and about 1:8 or about 1:6. An example range of high frequency plasma power may be between about 1680 W and about 4800 W, or about 2400 W for a four-station tool. An example range of low frequency plasma power may be between about 420 W and about 1200 W or about 600 W for a four-station tool.

The number of layers and/or the thickness of the films deposited in a bow compensation layer can also affect the wafer bow of the film. For example, to achieve a bow change of between about −200 μm and about −300 μm (such as to change a wafer having a warpage of +1000 μm to +800 μm (a change of −200 μm)), a film can be deposited to a thickness between 10000 Å and 15000 Å to achieve the desired bow change. Likewise, to achieve a bow change of between about +200 μm and about +300 μm (such as to change a wafer having a warpage of −400 μm to −200 μm (a change of −200 μm)), a film can be deposited to a thickness between 6000 Å and about 10000 Å to achieve the desired bow change.

Compensation for different wafer bowing may be used at different steps of a particular process flow. In some embodiments, different bow compensation layers having different stress and materials may be used to compensate for symmetrically bowed or saddle shaped wafers.

In some embodiments, the bow compensation layer may be removable. For example, after the bow compensation layer is deposited, the wafer may be transferred to another process chamber for additional processing such as lithography, deposition, etching, or other operations. Following these operations, the wafer may be warped and the bow compensation layer on the backside may be removed such that another bow compensation layer may be deposited to reduce warping of the wafer. In some embodiments, additional bow compensation layer may be deposited over an existing bow compensation layer to reduce warping such that bow compensation layers are ultimately removed in further downstream processing operations. In some embodiments, bow compensation layers are very thin and may not be removed at all.

Figure 3:
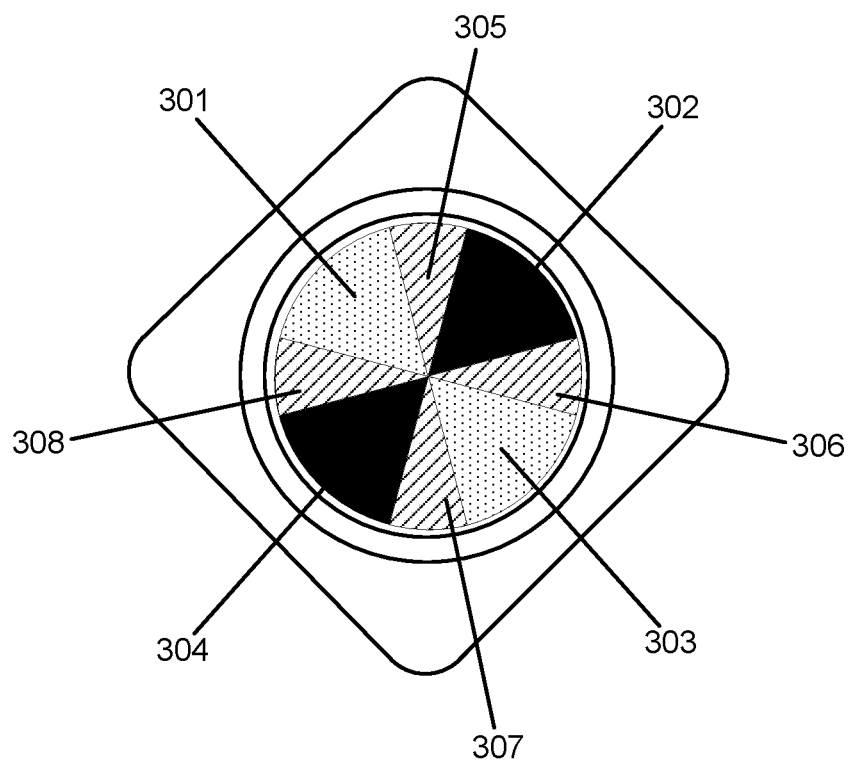

FIG. 3 provides an example of a divided showerhead surface having quadrants such as shown in FIG. 2 but with intermediate regions between quadrants to modulate the gas flow and deposition between quadrants to accommodate a variety of bowed semiconductor substrate bowing shapes.

Like FIG. 2, FIG. 3 includes quadrants 301 and 303 which may flow similar gas chemistries to deposit the same material, or different chemistries to deposit the same material, or different chemistries to deposit material having the same stress. FIG. 3 also includes quadrants 302 and 304, each of which may flow gas chemistries similar to each other but different from gases flowed to quadrants 301 and 303. Intermediate region 305 is between quadrant 301 and quadrant 302, intermediate region 306 is between quadrant 302 and 303, intermediate region 307 is between quadrants 303 and 304, and intermediate region 308 is between quadrants 304 and 301. Each intermediate region may involve flowing a combination of gases, such as a mixture of gases flowed to the adjacent quadrants. Intermediate mixing regions can be used to achieve a smooth film edge transition between quadrants. Intermediate mixing of various gases using different flow ratios can achieve intermediate stress films, particularly for areas of the bowed semiconductor substrate that may not be as warped as other regions. In some embodiments, the same material can be deposited to areas of different sizes to address the particular warpage of a wafer; for example, tensile silicon nitride may be deposited on a third of the wafer while compressive silicon nitride may be deposited on the remaining fourth of the wafer. Many variations may be used for addressing asymmetric warpage of various types on a bowed semiconductor wafer.

Apparatus

Disclosed embodiments may be performed in any suitable apparatus or tool. An apparatus or tool may include one or more process stations. Described below are an example process station and tool that may be used in some embodiments.

Figure 4:
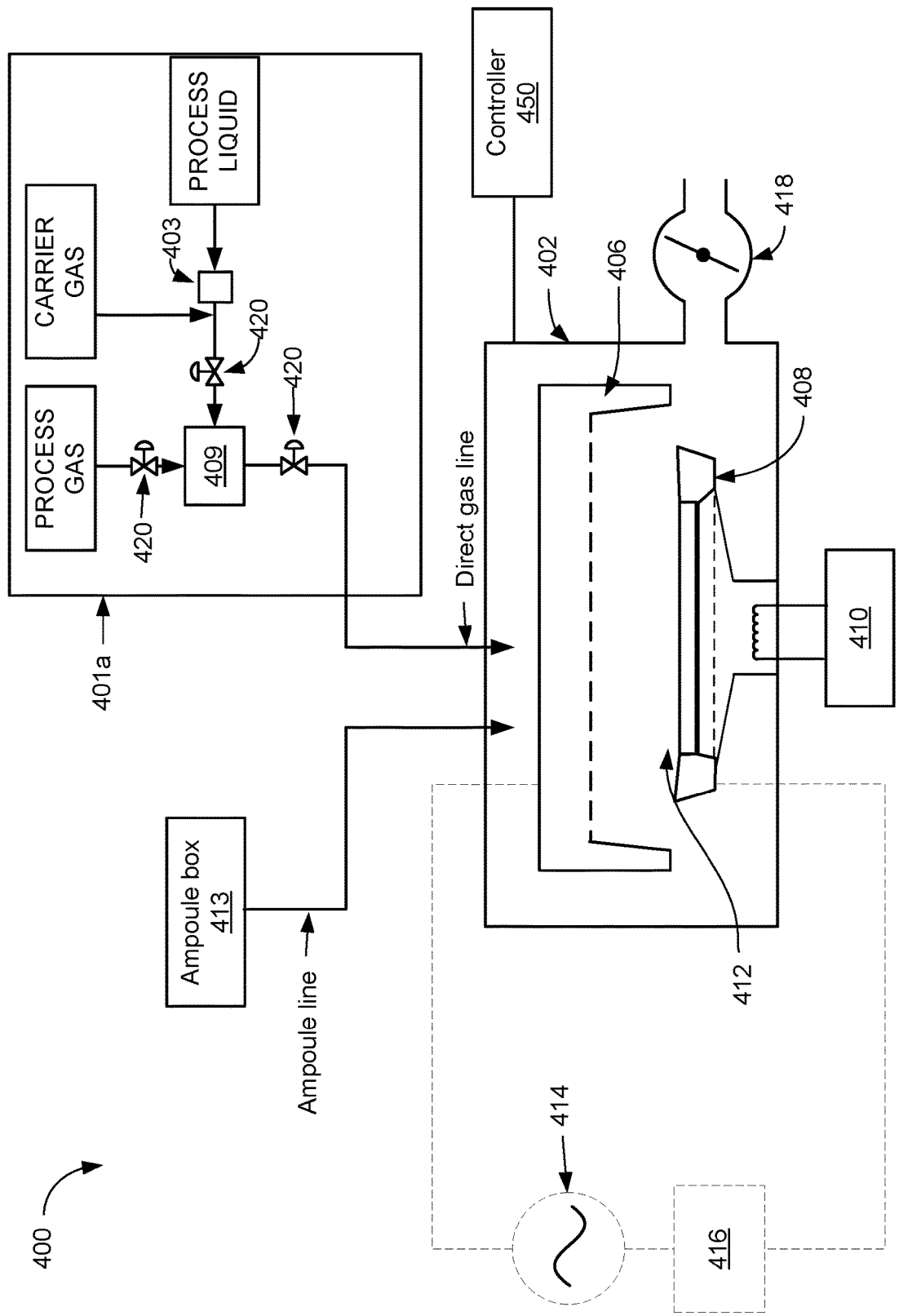
FIG. 4 is a schematic diagram of an example process station for performing disclosed embodiments.
Figure 5:
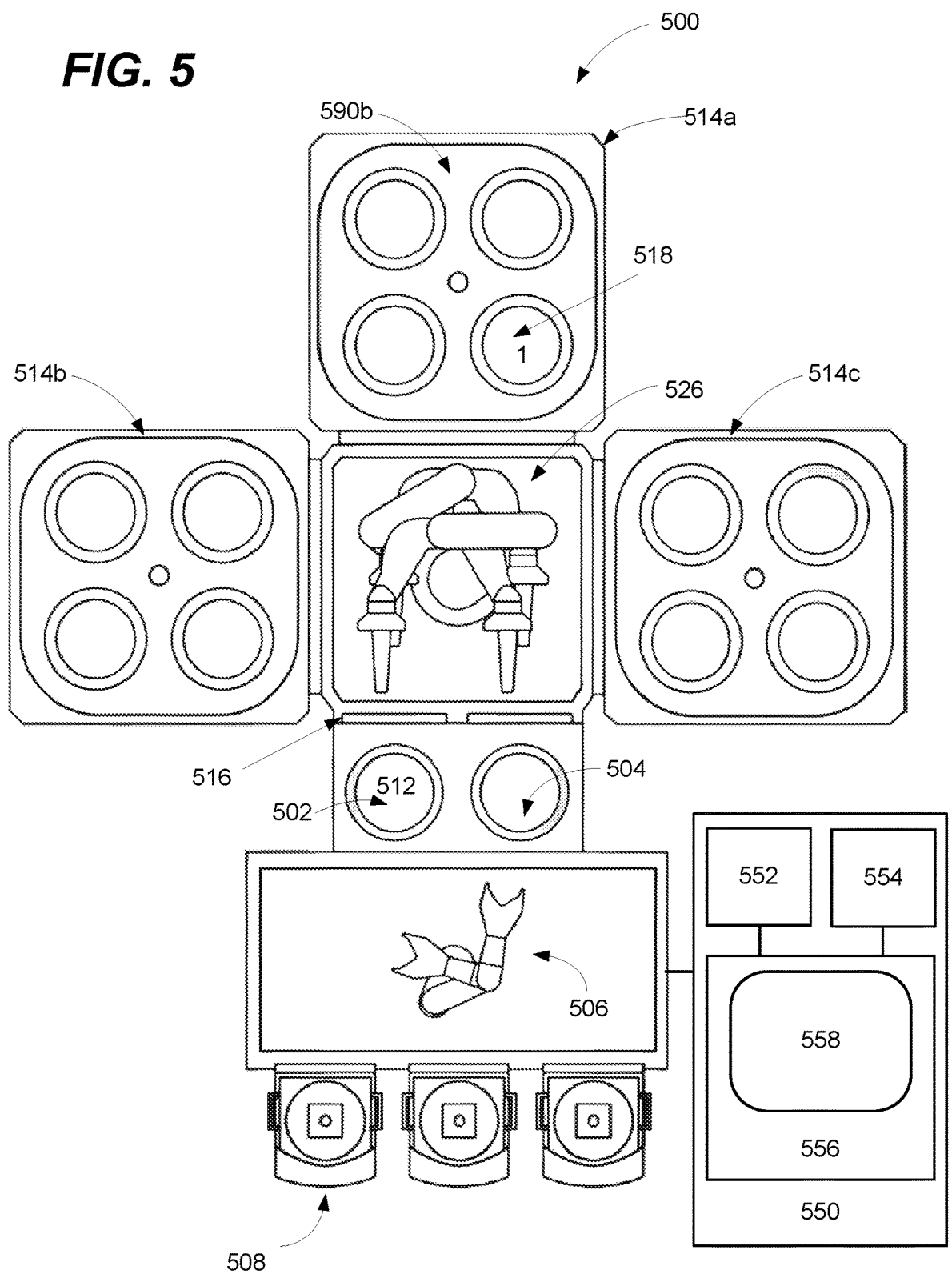
FIG. 5 is a schematic diagram of an example process tool for performing disclosed embodiments.

FIG. 4 depicts a schematic illustration of an embodiment of plasma-enhanced chemical vapor deposition (PECVD) process station 400 having a process chamber body 402 capable of maintaining a low pressure environment. A plurality of PECVD process stations 400 may be included in a common low pressure process tool environment. For example, FIG. 5 depicts an embodiment of a multi-station processing tool 500. In some embodiments, one or more hardware parameters of PECVD process station 400, including those discussed in detail below, may be adjusted programmatically by one or more computer controllers 450.

PECVD process station 400 fluidly communicates with reactant delivery system 401a for delivering process gases to a distribution showerhead 406. Reactant delivery system 401a includes a mixing vessel 404 for blending and/or conditioning process gases for delivery to showerhead 406. Process gases such as those used to deposit a bow compensation layer on a substrate may be delivered to the process chamber body 402 via showerhead 406 using the reactant delivery system 401a. In some embodiments, reactive species may be delivered using the reactant delivery system 401a. One or more mixing vessel inlet valves 420 may control introduction of process gases to mixing vessel 404. These valves may be controlled depending on whether a gas may be turned on during various operations.

Note that in some embodiments, a liquid reactant may not be used. However in some embodiments, a liquid reactant may be used to form a tensile or compressive film as described herein. As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant before or after vaporizing a reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant, such as a silicon-containing precursor, may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) (not shown) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for flowing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes gases toward substrate 412. For example, showerhead 406 may distribute process gases for depositing a bow compensation layer to the backside of the substrate 412 in various operations, such as silicon-containing gases and/or oxygen-containing or nitrogen-containing gases. In the embodiment shown in FIG. 4, the substrate 412 is located beneath showerhead 406 and is shown resting on a pedestal 408. The pedestal 408 may include wafer holders to hold a wafer by the edges and a bottom showerhead (not shown) for delivering gases to the backside of a wafer. Showerhead 406 may have any suitable shape, and may have any suitable number and arrangement of ports for distributing process gases to substrate 412. A shield (not shown) may also be present in the chamber body.

In another scenario, adjusting a height of pedestal 408 may allow a plasma density to be varied during disclosed processes such that the plasma density between the wafer and the bottom showerhead is varied. For example, the plasma may be activated when process gases are flowed to the chamber body 402. At the conclusion of the process, pedestal 408 may be lowered during another substrate transfer phase to allow removal of substrate 412 from pedestal 408.

In some embodiments, showerhead 406 and pedestal 408 electrically communicate with a radio frequency (RF) power supply 414 and matching network 416 for powering a plasma. In some embodiments, the plasma energy may be controlled by controlling one or more of a process station pressure, gas concentrations and partial pressures of gases or gas flow rates, an RF source power, and an RF source frequency. For example, RF power supply 414 and matching network 416 may be operated at any suitable power to form a plasma having a desired composition of radical species. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for a reaction for depositing a bow compensation layer.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of one or more gases (e.g., a silicon-containing gas and a nitrogen-containing gas), and time delay instructions for the first recipe phase. A second, subsequent recipe phase may include instructions for setting a flow rate of a purge gas and time delay instructions for the second recipe phase. Alternatively, a third recipe phase may include instructions for setting a flow rate of one or more gases (e.g., a silicon-containing gas and an oxygen-containing gas), and time delay instructions for the third recipe phase. It will be appreciated that these recipe phases may be further subdivided and/or iterated in any suitable way within the scope of the present disclosure. Controller 450 may also include any of the features described below with respect to controller 550 in FIG. 5.

In some embodiments, pedestal 408 may be temperature controlled via heater 410. Heater 410 may be used to anneal the substrate. For example, in some embodiments, during annealing, the heater 410 may be set to a temperature of at least about 450° C. Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506, at atmospheric pressure, is configured to move wafers from a cassette loaded through a pod 508 into inbound load lock 502 via an atmospheric port (not shown). A wafer or substrate is placed by the robot 506 on a pedestal 512 in the inbound load lock 502, the atmospheric port is closed, and the load lock is pumped down. Where the inbound load lock 502 includes a remote plasma source, the wafer may be exposed to a remote plasma treatment in the load lock prior to being introduced into one of the processing chambers such as processing chamber 514a. Further, the wafer also may be heated in the inbound load lock 502 as well, for example, to remove moisture and adsorbed gases. Next, a chamber transport port 516 to processing chamber 514a is opened, and another robot 526 places the wafer into the reactor on a pedestal 518 of a first station (labeled 1) of processing chamber 514a shown in the reactor for processing. While the embodiment depicted in FIG. 5 includes load locks, it will be appreciated that, in some embodiments, direct entry of a wafer into a process station may be provided.

Each of the depicted processing chambers, such as processing chamber 514a, includes four process stations. Each station has a heated pedestal, and gas line inlets. It will be appreciated that in some embodiments, each process station may have different or multiple purposes. For example, a process station may be used to deposit a tensile or compressive material as a part of a bow compensation layer by PECVD. While the depicted processing chamber 514a includes four stations, it will be understood that a processing chamber according to certain disclosed embodiments may have any suitable number of stations. For example, in some embodiments, a processing chamber may have five or more stations, while in other embodiments a processing chamber may have three or fewer stations. Additionally, while the depicted processing tool 500 has three processing chambers 514a, 514b, and 514c, it will be understood that a processing tool according to certain disclosed embodiments may have any suitable number of processing chambers.

FIG. 5 depicts an embodiment of a wafer handling system 590 for transferring wafers within processing chamber 514a. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 358 may include instructions for controlling the transfer of wafers into and out of a process chamber, rotating wafers within a process chamber, aligning wafers with the showerhead in a process chamber, transfer of wafers into and out of a process chamber, timing of gases out of particular regions of a showerhead, mixture of gases, amount of gas flow out of particular regions of a showerhead, chamber and/or station pressure, backside gas flow pressure out of particular regions of a showerhead, chamber and/or reactor temperature, wafer temperature, bias power, target power levels, RF power levels and type (such as single frequency or dual frequency or high frequency or low frequency), pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, electrostatic chuck power control program, and a plasma control program.

A substrate positioning program may include program code for process tool components that are used to load the substrate onto pedestal 518 and to control the spacing between the substrate and other parts of process tool 500. A process gas control program may include code for controlling gas composition (e.g., conditioning process gases, deposition gases, helium gas or other gas for backside flow, carrier gases, etc., as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, pressure of gas introduced to backside of a wafer during conditioning operations, etc.

A heater control program may include code for controlling the current to a heating unit that is used to heat the substrate for annealing operations described herein. Alternatively, the heater control program may control delivery of a heat transfer gas (such as helium) to the substrate. A plasma control program may include code for setting RF power levels applied to the process electrodes in one or more process stations in accordance with the embodiments herein. A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above described deposition processes. The program instructions may control a variety of process parameters, such as DC power level, RF bias power level, pressure, temperature, etc. The instructions may control the parameters to operate in-situ deposition of films according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases and/or inhibitor gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD or PECVD chamber or module, an ALD or PEALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a bowed semiconductor substrate having a first tensile region and a first compressive region;
aligning the bowed semiconductor substrate to a backside showerhead such that the first tensile region and first compressive region are aligned to nozzles of the backside showerhead; and
mitigating bowing of the bowed semiconductor substrate by depositing a bow compensation layer on a backside of the bowed semiconductor substrate, the bow compensation layer comprising a second tensile region and a second compressive region,
wherein the nozzles of the backside showerhead deliver gases for forming the second tensile region and the second compressive region on the backside of the bowed semiconductor substrate.

2. The method of claim 1, wherein the bow compensation layer is deposited by plasma enhanced chemical vapor deposition.

3. The method of claim 1, wherein the bowed semiconductor substrate after mitigating bowing has a warpage between −500 µm and +500 µm.

4. The method of claim 1, wherein the bowed semiconductor substrate is bowed up to about 100 µm as measured from a lowest point of the bowed semiconductor substrate to a highest point of the bowed semiconductor substrate prior to depositing the bow compensation layer.

5. The method of claim 1, wherein the bowed semiconductor substrate is saddle-shaped prior to depositing the bow compensation layer.

6. The method of claim 1, wherein the bowed semiconductor substrate has an x-axis bowing of greater than 200 µm and a y-axis bowing greater than 200 µm prior to depositing the bow compensation layer, and wherein either x-axis bowing or y-axis bowing is negative and the other is positive.

7. The method of claim 1, wherein the second tensile region comprises silicon nitride deposited by exposing the first tensile region to a silicon-containing precursor and ammonia and igniting a single frequency radio frequency plasma.

8. The method of claim 1, wherein the bow compensation layer is deposited in two or more separate operations.

9. The method of claim 8, wherein the two or more separate operations comprise an operation for deposition of the second tensile region of the bow compensation layer and an operation for deposition of the second compressive region of the bow compensation layer.

10. The method of claim 1, wherein the second compressive region comprises silicon oxide deposited by exposing the first compressive region to a silicon-containing precursor and nitrous oxide and igniting a single frequency radio frequency plasma.

11. The method of claim 1, wherein the second compressive region comprises carbon.

12. The method of claim 1, wherein the second compressive region comprises silicon.

13. The method of claim 1, wherein the second compressive region is deposited on the first compressive region of the bowed semiconductor substrate by igniting a dual frequency radio frequency plasma or a low frequency radio frequency plasma.

14. The method of claim 1, wherein deposition of the bow compensation layer comprises flowing nitrogen to a first set of two opposite quadrants while flowing a silicon-containing precursor and ammonia to the backside of the bowed semiconductor substrate to a second set of two opposite quadrants and igniting a radio frequency plasma, rotating the bowed semiconductor substrate by 90 degrees, and flowing a silicon-containing precursor and nitrous oxide to the first set of two opposite quadrants and igniting a dual frequency radio frequency plasma.

15. The method of claim 1, wherein the bow compensation layer comprises material from the group consisting of silicon oxide, silicon nitride, carbon, silicon, and combinations thereof.

16. The method of claim 1, wherein the bow compensation layer comprises two or more compositions.

17. A method comprising:
provlding a bowed semiconductor substrate having a first tensile region and a first compressive region; and
mitigating bowing of the bowed semiconductor substrate by depositing a bow compensation layer on a backside of the bowed semiconductor substrate, the bow compensation layer comprising a second tensile region and a second compressive region,
wherein the second tensile region and second compressive region of the bow compensation layer are on alternating quadrants of the bow compensation layer.

18. The method of claim 1, wherein flow of a silicon-containing gas to the backside of the bowed semiconductor substrate modulates stress of the bow compensation layer.

19. The method comprising:
providing a bowed semiconductor substrate having a first tensile region and a first compressive region; and
mitigating bowing of the bowed semiconductor substrate by depositing a bow compensation layer on a backside of the bowed semiconductor substrate, the bow compensation layer comprising a second tensile region and a second compressive region,
wherein depositing the bow compensation layer further comprises flowing a mixture of gases to intermediate regions between two or more adjacent quadrants.

* * * * *